US008613798B2

(12) United States Patent
Lee et al.

(10) Patent No.: US 8,613,798 B2
(45) Date of Patent: Dec. 24, 2013

(54) BAND GAP TUNING IN TRANSITION METAL OXIDES BY SITE-SPECIFIC SUBSTITUTION

(75) Inventors: Ho Nyung Lee, Oak Ridge, TN (US); Matthew F. Chisholm, Jr., Oak Ridge, TN (US); Gerald Earle Jellison, Jr., Oak Ridge, TN (US); David J. Singh, Oak Ridge, TN (US); Woo Seok Choi, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 143 days.

(21) Appl. No.: 13/401,100

(22) Filed: Feb. 21, 2012

(65) Prior Publication Data
US 2013/0213263 A1 Aug. 22, 2013

(51) Int. Cl.
*C09D 1/00* (2006.01)

(52) U.S. Cl.
USPC ............... 106/286.2; 106/286.1; 106/286.3; 106/286.4; 106/286.6; 106/286.7; 106/286.8

(58) Field of Classification Search
USPC .............. 106/286.2; 149/286.1, 286.2, 286.3, 149/268.4, 286.6, 286.7, 286.8
See application file for complete search history.

(56) References Cited

U.S. PATENT DOCUMENTS

| 7,410,917 B2* | 8/2008 | Ahn et al. ............... 438/785 |
| 7,465,983 B2* | 12/2008 | Eldridge et al. ............ 257/314 |
| 7,510,904 B2* | 3/2009 | Chu et al. ............... 438/94 |
| 2001/0013311 A1* | 8/2001 | Migita et al. ............ 117/1 |
| 2007/0269683 A1* | 11/2007 | Chen et al. ............... 428/697 |

* cited by examiner

*Primary Examiner* — James McDonough
(74) *Attorney, Agent, or Firm* — Joseph A. Marasco

(57) ABSTRACT

A transition metal oxide insulator composition having a tuned band gap includes a transition metal oxide having a perovskite or a perovskite-like crystalline structure. The transition metal oxide includes at least one first element selected from the group of Bi, Ca, Ba, Sr, Li, Na, Mg, K, Pb, and Pr; and at least one second element selected from the group of Ti, Al, V, Cr, Mn, Fe, Co, Ni, Cu, Zr, Nb, Mo, Ru, Rh, Pd, Hf, Ta, W, Re, Os, Ir, and Pt. At least one correlated insulator is integrated into the crystalline structure, including $REMO_3$, wherein RE is at least one Rare Earth element, and wherein M is at least one element selected from the group of Co, V, Cr, Ni, Mn, and Fe. The composition is characterized by a band gap of less than 4.5 eV.

14 Claims, 14 Drawing Sheets

◉ Bi in $Bi_2O_2$

● Bi in $Bi_2Ti_3O_{12}$

◉ Ti

○ O

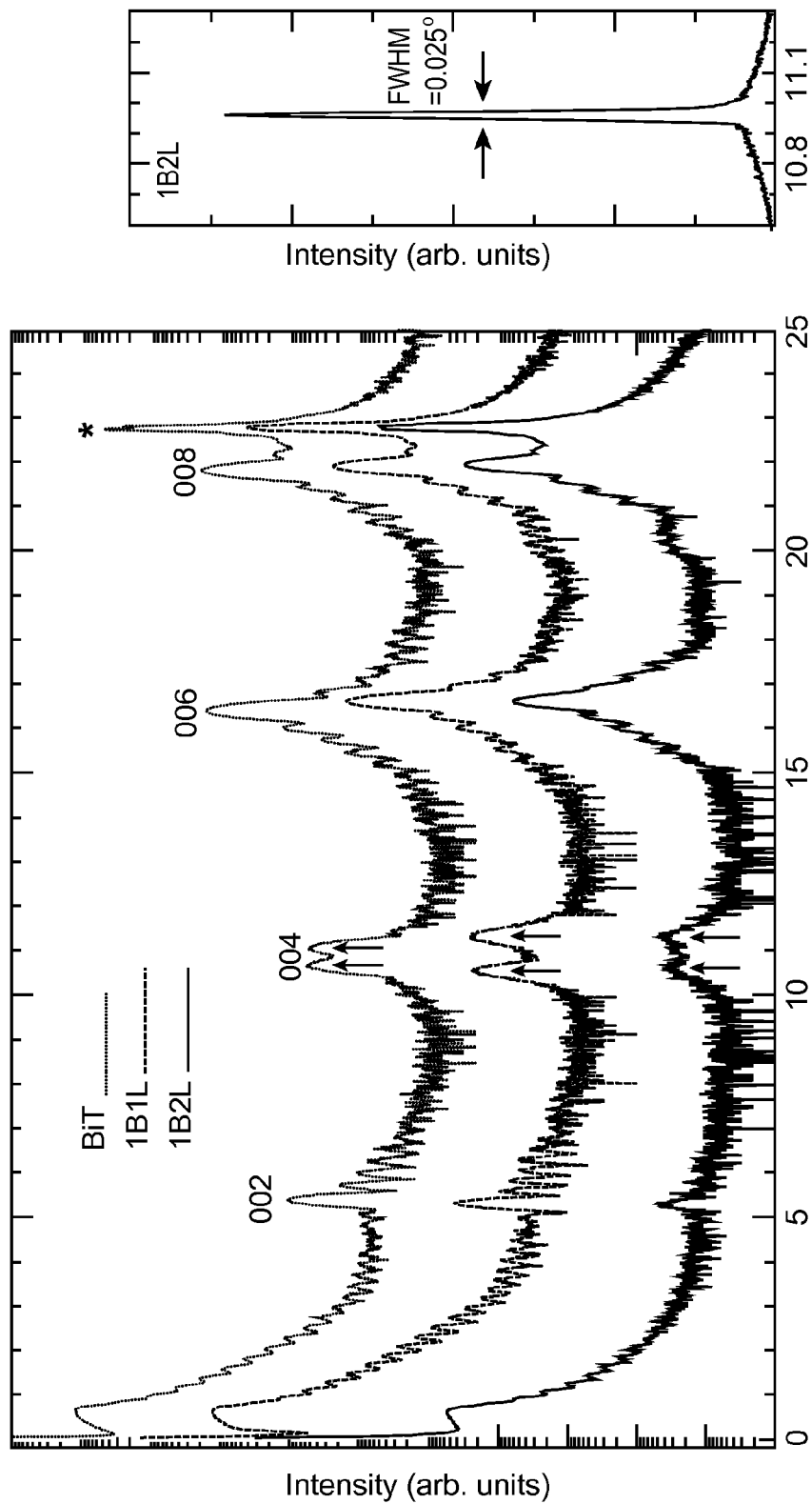

BAND GAP TUNING IN TRANSITION METAL OXIDES BY SITE-SPECIFIC SUBSTITUTION

STATEMENT REGARDING FEDERALLY SPONSORED RESEARCH

The United States Government has rights in this invention pursuant to contract no. DE-AC05-00OR22725 between the United States Department of Energy and UT-Battelle, LLC.

CROSS-REFERENCE TO RELATED APPLICATIONS

None

NAMES OF PARTIES TO A JOINT RESEARCH AGREEMENT

None

BACKGROUND OF THE INVENTION

Bandgap tuning is at the core of current materials research and optoelectronic device applications. Through successful tuning of the bandgap in semiconductors, bandgap—tailored heterostructures including two-dimensional electron gas and tunneling structures were realized. Such advancements offered a greater understanding of physics regarding quantum electrodynamics and stimulated emergence of many related devices. Moreover, the ability to tune the bandgap is becoming increasingly important for developing highly efficient solar cells and transparent conducting oxides.

For conventional III-V and II-VI semiconductors, simple bandgap tuning has been extremely successful, leading to realization of the structures mentioned above. For example, GaAs has a bandgap of 1.42 eV, which can be continuously tuned down to 0.35 eV or up to 2.12 eV by substituting In or Al for Ga, respectively. Such simple alloying results in a bandgap spectrum of larger than 1 eV.

On the other hand, recent breakthroughs in complex oxides have provided an opportunity to incorporate our understanding of semiconductors into the exotic physics of transition metal oxides (TMOs). For example, the observation of quantum transport behaviors in several complex oxides manifest a substantial improvement of oxides in terms of their quality and leading to properties that were thought to be unique to semiconductors. However, substantial and controllable bandgap tuning has yet to be achieved in TMOs, despite intense effort. To tune the bandgap of TMOs, one might consider modifying or substituting the transition metal with another element, because the rigid nature of the bandgap originates mostly from the strongly localized character of the d-electrons. However, what has been observed is that the fascinating physical properties of TMOs arising from the d-electrons disappear with the modified bandgap.

Such difficulties have hampered the recent searches for more efficient transparent conducting oxides and low-bandgap photovoltaic oxides. Ferroelectric oxides, in particular, are attracting renewed attention owing to their inherent built-in potential arising from the spontaneous polarization, which could be used to efficiently separate photon-induced electron-hole pairs.

Possibilities of oxide optoelectronics are being ceaselessly investigated as a way to overcome the eminent issues of Si-based semiconductor electronics. The strong correlation of d-electrons and oxygen in transition metal oxides results in exotic physical properties and, therefore, emergent phenomena such as superconductivity, colossal magnetoresistance, and ferroelectrics are observed. However, current oxide materials also have their own drawbacks to catch up the semiconductors. One of the most important characteristics required for the oxides is the ability to systematically tune the band gap. The band gap in semiconductors can be continuously controlled over an electron volt (eV) by simple doping, enabling band gap engineering relevant for numerous devices including high electron-mobility transistor and tunneling devices. However, the band gap in transition metal oxides cannot be tuned easily, due to the rigid nature of d-electron bands. Up to this point, less than 0.2 eV band gap spectrum has been achieved for transition metal oxides. The present invention is directed to the need for methods and materials to easily and systematically control the band gap of complex transition metal oxides.

BRIEF SUMMARY OF THE INVENTION

In accordance with one aspect of the present invention, the foregoing and other objects are achieved by a transition metal oxide insulator composition having a tuned band gap. The composition includes a transition metal oxide having a crystalline structure selected from the group consisting of a perovskite crystalline structure and a perovskite-like crystalline structure. The transition metal oxide includes at least one first element selected from the group Bi, Ca, Ba, Sr, Li, Na, Mg, K, Pb, and Pr; and at least one second element selected from the group Ti, Al, V, Cr, Mn, Fe, Co, Ni, Cu, Zr, Nb, Mo, Ru, Rh, Pd, Hf, Ta, W, Re, Os, Ir, and Pt. At least one correlated insulator is integrated into the crystalline structure, the correlated insulator including $REMO_3$, wherein RE is at least one element selected from the group La, Ce, Pr, Nd, Pm, Sm, Eu, Gd, Tb, Dy, Ho, Er, Tm, Yb, and Lu, and wherein M is at least one element selected from the group Co, V, Cr, Ni, Mn, and Fe. The composition is characterized by a band gap of less than 4.5 eV.

The crystalline structure can be a layered tetragonal crystalline structure or a pseudo-orthorhombic crystalline structure.

BRIEF DESCRIPTION OF THE DRAWINGS

FIG. 3 is a graph showing X-ray θ-2θ diffraction patterns of BiT, 1B1L, and 1B2L thin films. The 001 peak from STO substrates is indicated by an asterisk(*); separation of the 004 peak in BiT-LC is indicated by arrows.

FIG. 4 is a graph showing X-ray rocking curve of the 008 reflection of 1B2L (full width at half maxima=0.025°).

For a better understanding of the present invention, together with other and further objects, advantages and capabilities thereof, reference is made to the following disclosure and appended claims in connection with the above-described drawings.

DETAILED DESCRIPTION OF THE INVENTION

The present invention sets forth a new and useful pathway to systematic tuning of the band gap in transition metal oxides, employing a layered ferroelectric oxide. By using the Mott insulator $LaCoO_3$ as a dopant material, we could reduce the band gap of $Bi_4Ti_3O_{12}$ from 3.55 eV to 2.65 eV. Particularly, we used "site-specific substitutional doping" to replace only $Bi_2O_2$ layer within $Bi_4Ti_3O_{12}$ with $LaCoO_3$ to reduce the band gap, but preserved most of the $Bi_2Ti_3O_{10}$ layer to maintain good ferroelectricity.

Figure 1:
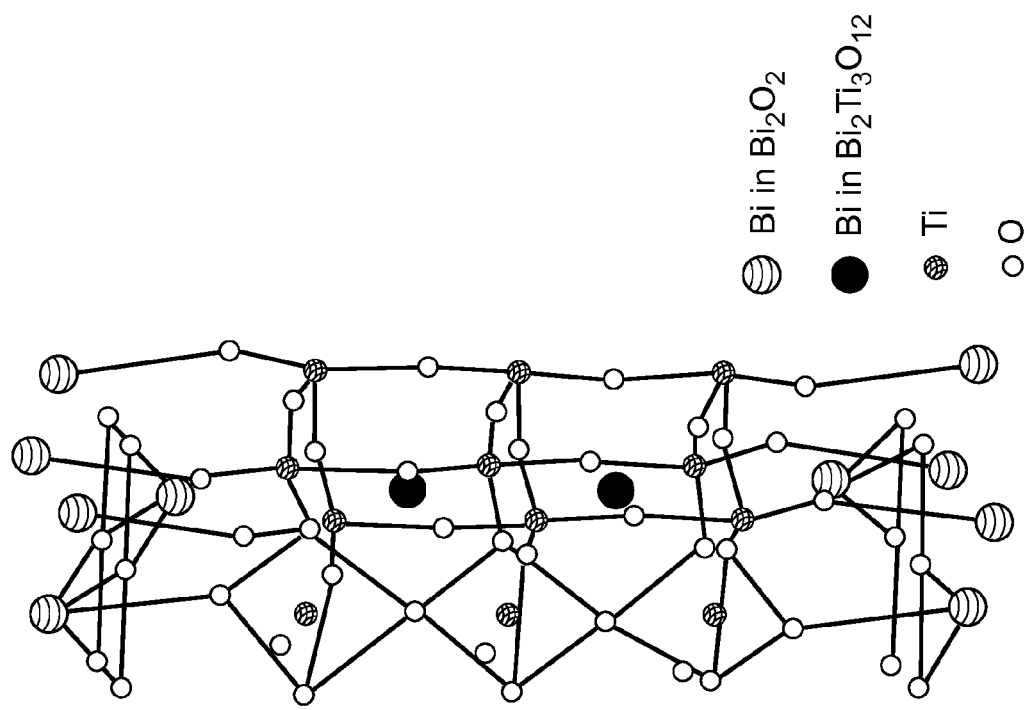
FIG. 1 is a schematic diagram of a half pseudo-orthorhombic unit cell of $Bi_4Ti_3O_{12}$ (BiT) in accordance with examples of the present invention.

To identify a useful route for effectively controlling the bandgap in complex oxides, we focused on the ferroelectric $Bi_4Ti_3O_{12}$ (BiT), which has an optical bandgap energy reported between 3.1 and 3.6 eV. Unlike typical ferroelectric perovskites such as $BaTiO_3$, $Pb(Zr,Ti)O_3$, or $BiFeO_3$, BiT has an Aurivillius phase with a highly anisotropic, monoclinic (pseudo-orthorhombic, a=5.450 Å, b=5.406 Å and c=32.832 Å), layered structure with two alternating atomic arrangements; one fluorite-like $(Bi_2O_2)^{2-}$ layer and two perovskite $(Bi_2Ti_3O_{10})_{2+}$ layer blocks connected with an extra oxygen plane, as schematically shown in FIG. 1. Note that the c axis lattice constant of BiT is about eight times longer than that of usual simple perovskites. The ferroelectric polarization in BiT mainly points along the a axis direction and is known to originate mostly from the perovskite sublayers, i.e., the shift of cations relative to oxygen ions within the perovskite blocks.

Figure 2:
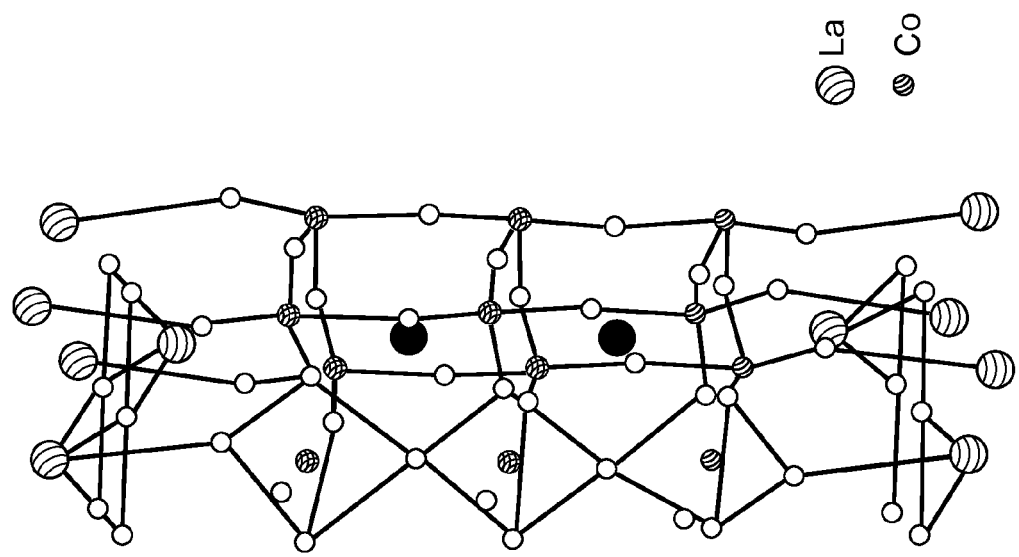
FIG. 2 is a schematic diagram of a half pseudo-orthorhombic unit cell of $Bi_4Ti_3O_{12}$—$LaCoO_3$ (1B1L) in accordance with examples of the present invention.

One of the most attractive properties of this bismuth-layered material is its excellent sustainability of ferroelectricity even after intrusion of some oxygen vacancies. (Note that simple perovskite-typed ferroelectrics are usually less tolerant to oxygen vacancies.) Thus, the unique layered structure of BiT provides an opportunity to examine site-specific substitutional alloying for altering the bandgap without losing the ferroelectricity. The alloying material was selected among simple perovskite TMOs with low bandgap and high absorption (a) above the bandgap. $LaTMO_3$ was our natural choice for the perovskite, as La doping is well known to stabilize the ferroelectricity in BiT. Among $LaTMO_3$, $LaCoO_3$ (LCO) is chosen as the alloying material. LCO is a Mott insulator with a small bandgap of 0.1 eV and also a high α originating from the Co 3 d—electronic states. It also has a rhombohedral structure (a=5.378 Å) with an in-plane lattice mismatch with BiT<1%, readily allowing coherent incorporation into BiT without destroying the overall layered structure, as schematically shown in FIG. 2.

LCO-alloyed BiT (BiT-LC) was studied in order to elucidate bandgap tuning in complex TMOs. Through site-specific substitutional alloying, we successfully reduced the bandgap as much as about 1 eV, without deterioration of the ferroelectricity of BiT. Moreover, we observed enhanced photoresponses from the alloyed BiT thin films, clearly confirming the bandgap reduction.

Preparation of Thin Films

We used pulsed laser epitaxy (PLE) (also known as pulsed laser deposition) to deposit $Bi_4Ti_3O_{12}$—$LaCoO_3$ (BiT-LC) films on $SrTiO_3$ substrates. By using co-ablation method, we could create a self-ordered superstructure of $Bi_4Ti_3O_{12}$—$LaCoO_3$, as shown schematically in FIG. 2. The LC is integrated into the BiT crystalline structure.

PLE was used to fabricate high-quality BiT-LC epitaxial thin films on $SrTiO_3$ (STO) substrates. The fabricated BiT-LC samples were intended to have either one or two pseudo-cubic unit cell layers of LCO incorporated into one unit cell layer of BiT, which hereinafter will be nominally called as $1Bi_4Ti_3O_{12}$—$1LaCoO_3$ (1B1L) or $1Bi_4Ti_3O_{12}$—$2LaCoO_3$ (1B2L), respectively. (However, in reality, much less Co was incorporated in the films relative to the La substitution as discussed later.) For higher concentrations of LCO alloying, coherent incorporation was not obtained, resulting in a severe degradation of the unique layered structure of BiT.

It is contemplated that substitutions can be made, with varying degrees of success in tuning the bandgap. In the present invention, Although Bi is used in many of the examples, any one or combination of the following elements may be used: Bi, Ca, Ba, Sr, Li, Na, Mg, K, Pb, and Pr. Moreover, although Ti is used in many of the examples, any one or combination of the following elements may be used: Ti, Al, V, Cr, Mn, Fe, Co, Ni, Cu, Zr, Nb, Mo, Ru, Rh, Pd, Hf, Ta, W, Re, Os, Ir, and Pt. Moreover, although La is used in many of the examples, any one or combination of the following elements may be used: La, Ce, Pr, Nd, Pm, Sm, Eu, Gd, Tb, Dy, Ho, Er, Tm, Yb, and Lu. Moreover, although Co is used in many of the examples, any transition metal, particularly one or combination of the following elements, may be used: Co, V, Cr, Ni, Mn, and Fe.

Site-Specific Substitution

Figures 5, 6:
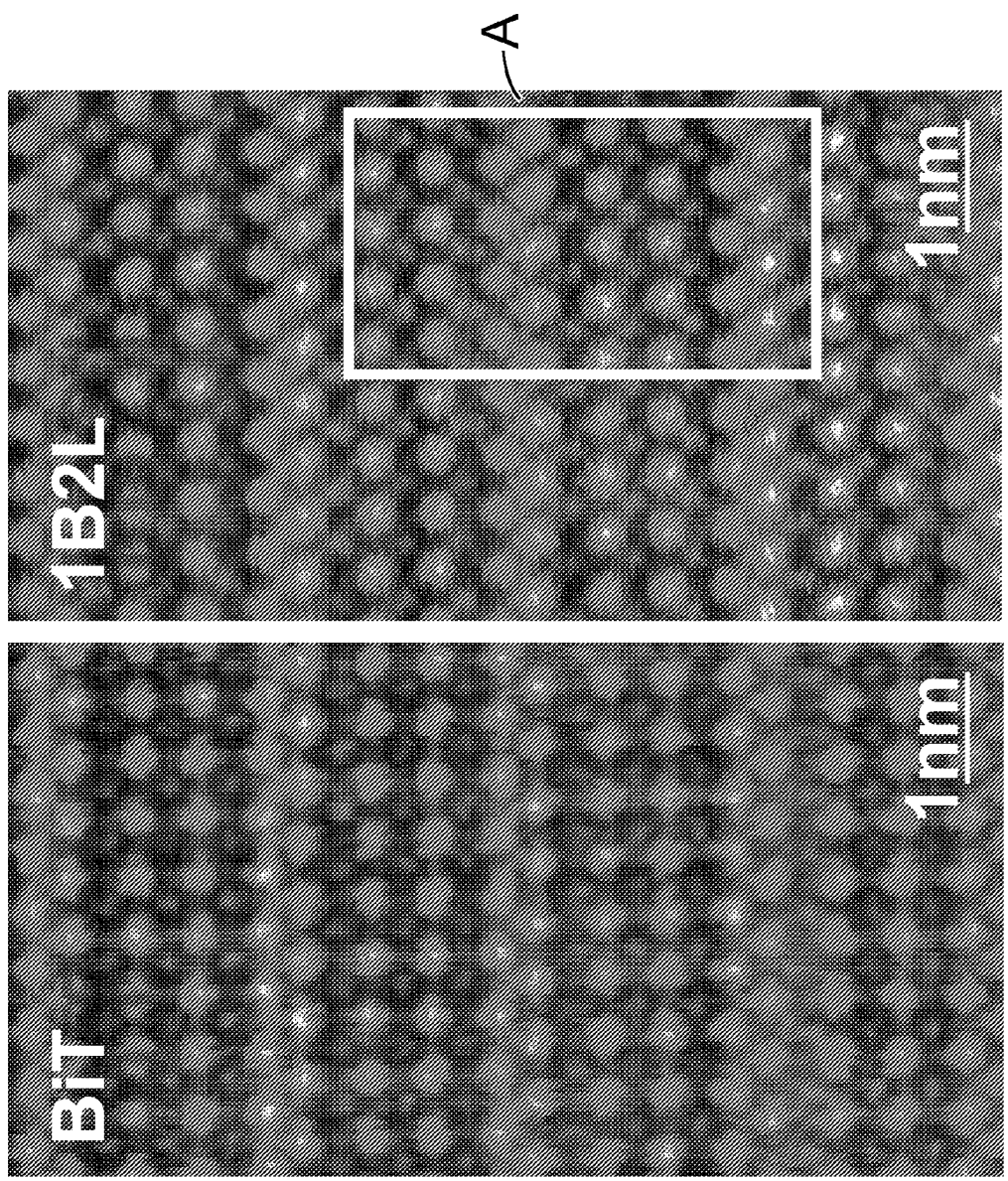
FIG. 5 is an atomic resolution Z-contrast STEM image of BiT.
FIG. 6 is an atomic resolution Z-contrast STEM image of 1B2L. The overall layered structure of BiT is well preserved despite the incorporation of LC, indicating that some portions of BiT are substituted by La and Co without deteriorating the layered structure.

The crystal structure of the BiT-LC thin films were characterized using X-ray diffraction (XRD) and Z-contrast scanning transmission electron microscopy (STEM), showing clear evidence of substitutional alloying. FIGS. 3, 4 show XRD θ-2θ and rocking curve scans, respectively, from BiT-LC thin films. The well-defined thickness fringes observed for most of the peaks in θ-2θ patterns together with very narrow full width at half maxima (Δw~0.025 Deg.) in rocking curve scans indicate an atomically smooth surface and interface as well as excellent crystallinity of our thin films. (Note that the full width at half maxima in XRD rocking curves in our films reported here is drastically reduced at least by a factor of three as compared with the values from previous epitaxial films.) Overall peak positions of the main peaks remain unchanged for all the samples up to 1B2L, indicating that the overall Aurivillius structure of BiT is well preserved even after the substitution. This suggests that La and Co were successfully incorporated in BiT. Z-contrast STEM investigations confirm this substitutional alloying, where the characteristic stacking of BiT layers is clearly preserved in BiT-LC as shown in FIGS. 5, 6.

Figures 7, 8, 9:
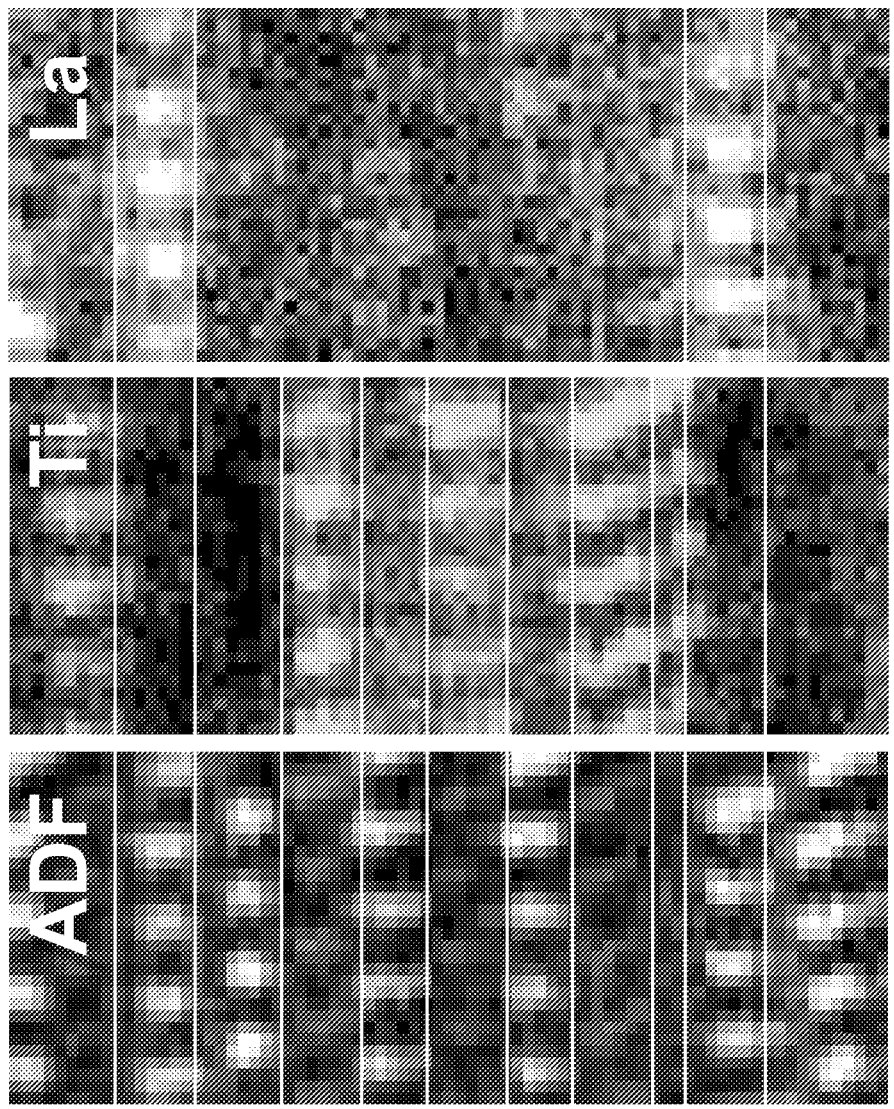
FIG. 7 is an annular dark field (ADF) image of the general area of rectangle A in FIG. 6.
FIG. 8 is an electron energy loss spectroscopy (EELS) elemental map of the general area of Ti of rectangle A in FIG. 6.
FIG. 9 is an electron energy loss spectroscopy (EELS) elemental map of La of the general area of rectangle A in FIG. 6, showing that La mostly substitutes for Bi in the upper layer of the $Bi_2O_2$ layer.

A more crucial observation obtained from STEM is the signature of site-specific alloying. FIGS. 7, 8, 9 show a magnified annular dark field (ADF) image along with the elemental maps of Ti and La obtained by electron energy-loss spectroscopy (EELS) in a 1B2L sample. The ADF image mostly shows bright features at the Bi and La sites with reduced intensity from the Ti sites. The alternating $Bi_2O_2$ and $Bi_2Ti_3O_{10}$ sublayers are clearly seen. The Ti map obtained using the Ti-L edge shows that Ti is localized within the $Bi_2Ti_3O_{10}$ sub-layer only. The La map shows the asymmetric La substitution for Bi with preferential substitution into the upper layer of Bi within the $Bi_2O_2$ sub-layer. While considerably less Co incorporation in BiT is detected by STEM-EELS, Co is seen to substitute for Ti. The small amount of Co substitution makes it difficult to determine whether it, similar to La, is asymmetrically incorporated in BiT. However, as discussed further herein, it is suggested that the La and Co substitution in BiT mostly takes place near the $Bi_2O_2$ sub-layer region, forming a site-specifically alloyed, self-ordered superstructure.

The reduced incorporation of Co relative to La in our thin films seems to originate from the energetically unfavorable electronic state of Co and the different adsorption rate of the elements during the deposition. As Co has two primary valence state in oxides ($Co^{3+}$ and $Co^{2+}$), where $Co^{2+}$ is generally more stable, Co substitution in either case for $Ti^{4+}$ is more difficult as it requires a compensation of the charge difference, while $La^{3+}$ could readily substitute for volatile $Bi^{3+}$. Nevertheless, the impact of Co on the bandgap change is amazingly large as discussed later. Moreover, it has been reported that O vacancies readily form in the Aurivillius structure and prefer sites near the $Bi_2O_2$ layer, without compromising the ferroelectricity. Therefore, further considering the difference in ionic size as well as electronegativity, we presume that Co preferentially substitutes for Ti next to the $Bi_2O_2$ layer accompanying O vacancies to compensate valence difference.

Site-specific substitution of LCO is further supported by the XRD θ-2θ patterns in FIG. 3. In the XRD θ-2θ patterns, it should be noted that the peak intensity of higher order peaks (006 and 008) stays almost the same with increasing La and Co substitution as the ones from pure BiT, but that of lower order peaks (002 and 004) decreases as shown in FIG. 3. This indicates that the short period perovskite structure is conserved on alloying, but the long period Bi2O2 sub-layer seems to be disturbed. Another important observation is the separation of the 004 peak in all of our samples, as indicated with the arrows in FIG. 3. While the origin of the peak separation is not yet clear, it suggests that there is a change in the c/4 lattice of BiT. This might originate from the fact that the distance between upper and lower Bi to O within the Bi2O2 layer is slightly different; the difference between the quarter of the c axis lattice constants (c'/4 and c'/4) is 0.03 nm for the pure BiT film, as schematically shown in FIG. 1. The separation of the 004 peak increases when LCO alloying is introduced, where the c/4 lattice constant difference further increases to about 0.06 nm for both 1B1L and 1B2L. The increase of modulation by alloying LCO accounts for the observation in STEM, where La preferentially substitutes in the upper Bi layer within the $Bi_2O_2$ sub-layer in BiT.

Persistent Ferroelectricity

Figure 11:
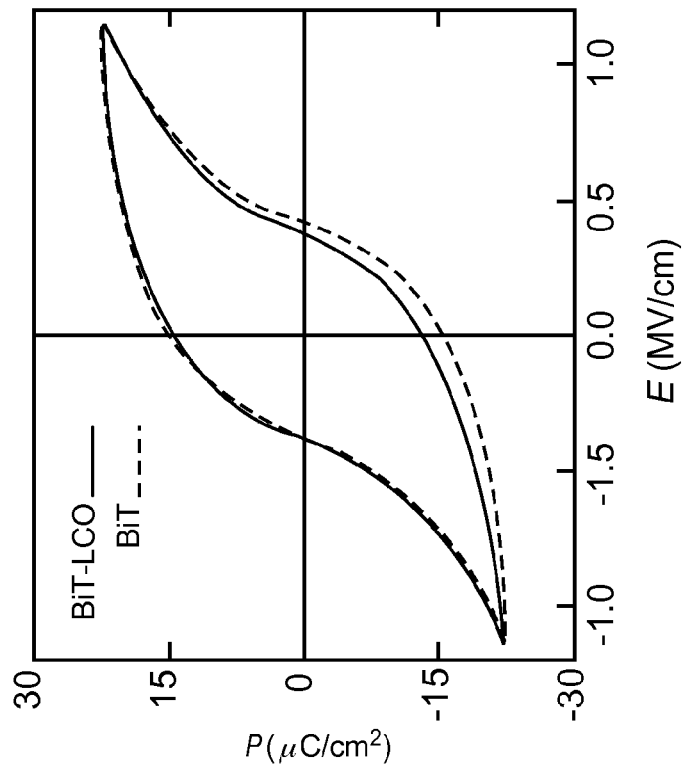
FIG. 11 is a graph showing P(E) hysteresis loops of BiT and BiT-LC.

To check the effect of the substitution on the ferroelectric properties of BiT-LC films, we have grown (104)-oriented films on STO (111) covered with $SrRuO_3$ bottom electrodes. (It was rather difficult to characterize the ferroelectric properties from a c axis oriented film as its primary polar axis is lying along the in-plane direction.) The polarization of a (104)-oriented film is tilted by 54.7 π from the normal of the film plane. We measured the polarization (P) as a function of electric field (E) as shown in FIG. 11. Surprisingly, the overall shape of the P(E) loop from BiT-LC is almost identical to that from the pure BiT, indicating its persistent ferroelectricity even after the substitution. The remnant polarization is ~15 $\mu C\ cm^{-2}$ for both BiT and BiT-LC, comparable to the previously reported values of 15.9 $\mu C\ cm^{-2}$ from a (104)-oriented La doped BiT film.

Figure 21:
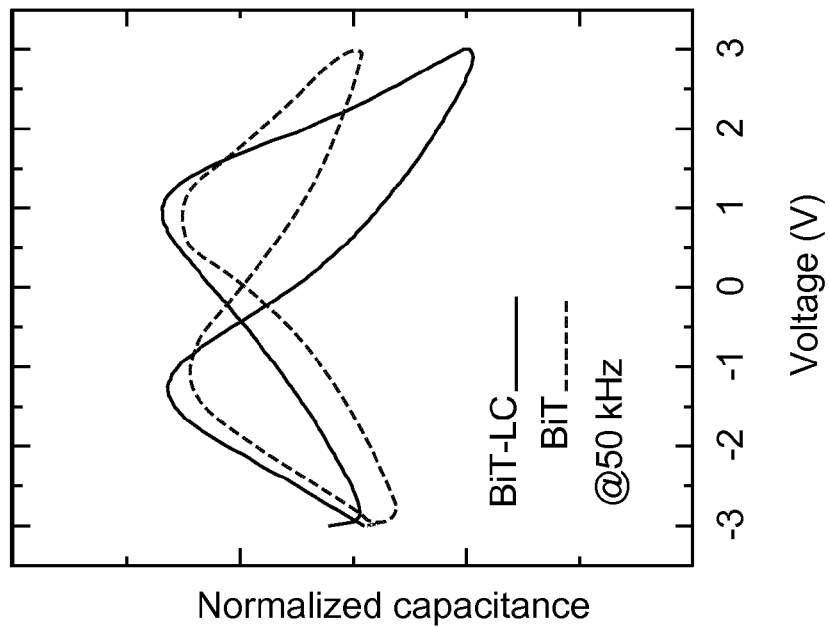
FIG. 21 is a graph showing C-V curves of (104)-oriented BiT and 1B2L films. The capacitance is normalized due to the different film thickness. The calculated dielectric constants are around 85.
Figure 20:
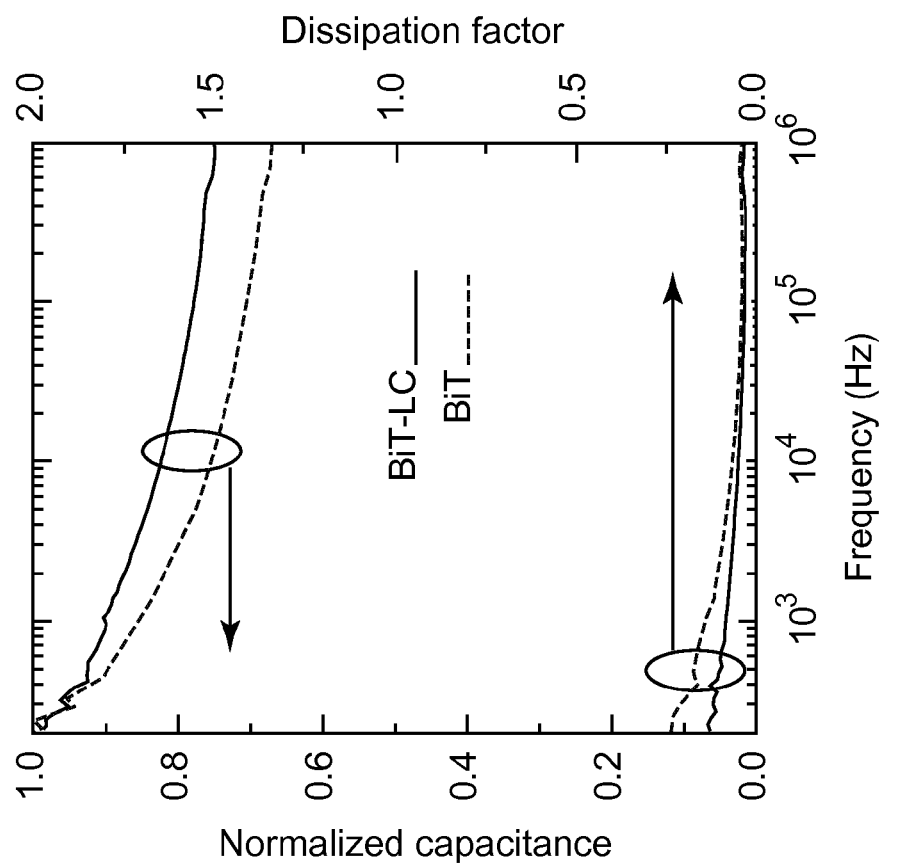
FIG. 20 is a graph showing Cf and tanδ curves of (104)-oriented BiT and 1B2L films. The capacitance is normalized due to the different film thickness.
Figure 22:
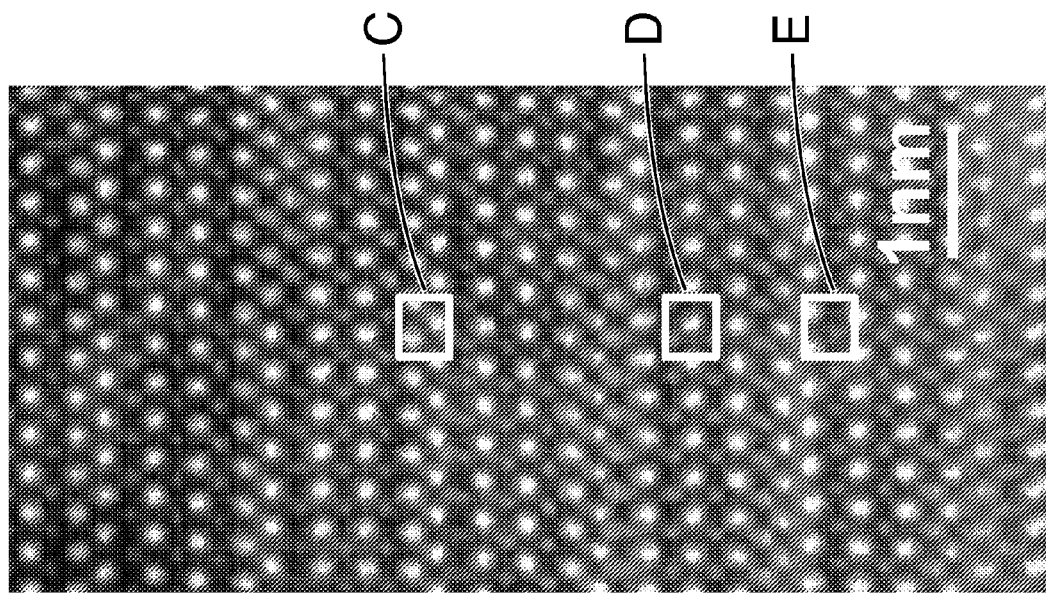
FIG. 22 is a cross-sectional Z-contrast STEM image of 1B2L. The growth direction of the imaged film is from the bottom to the top of the image.
Figure 24:
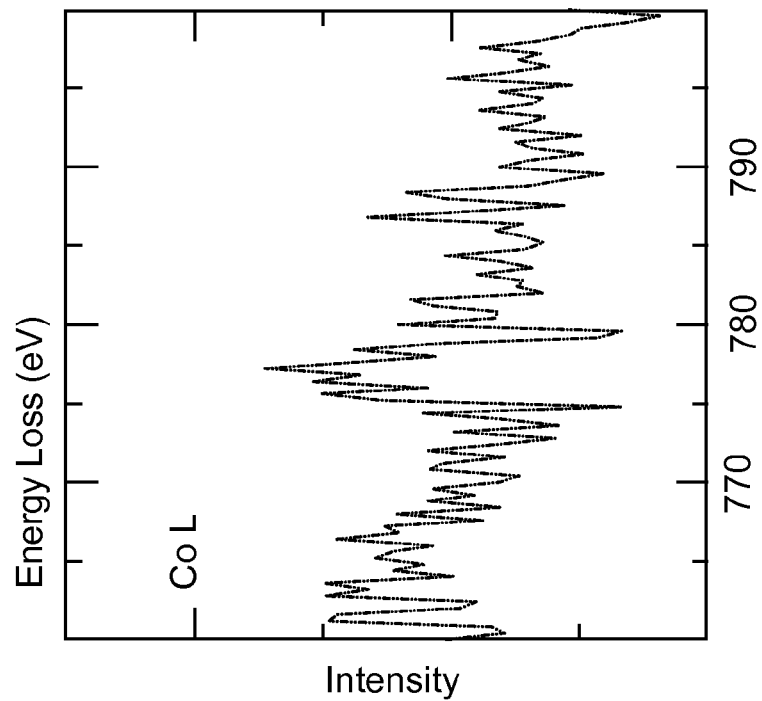
FIG. 24 is a graph showing magnified section F of the Co L-edge showing small signal of Co.
Figure 23:
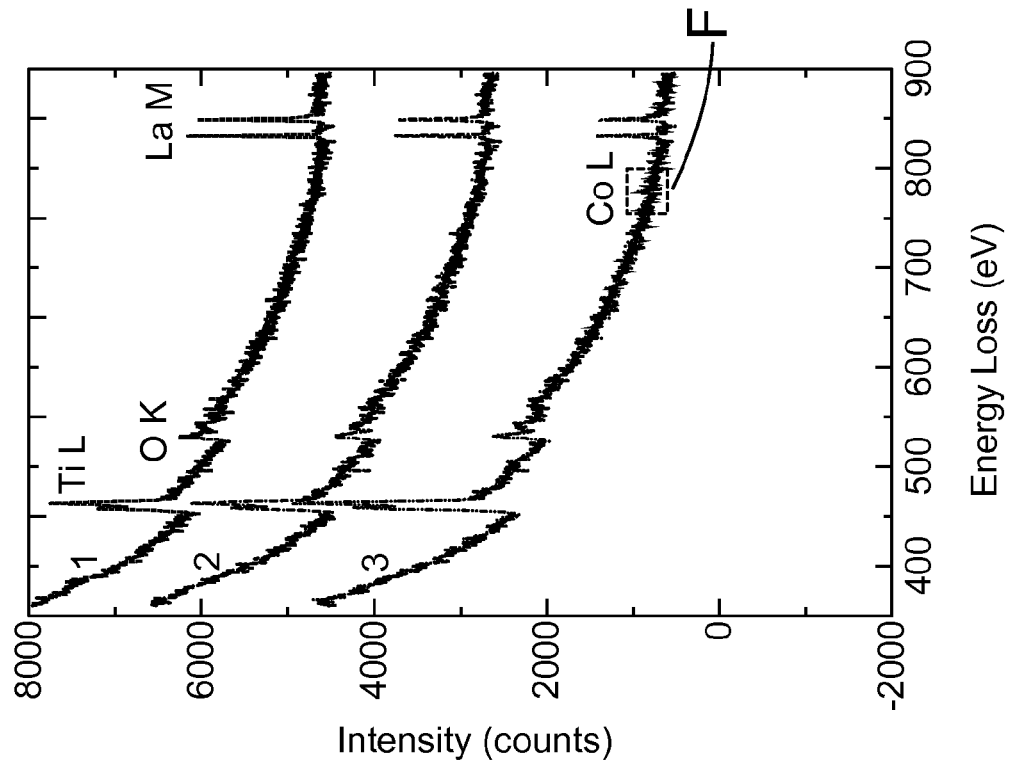
FIG. 23 is a comparative graph showing EELS data corresponding to the rectangles C, D, E in FIG. 22. The y-axis is in arbitrary units with spectra 2 and 3 offset upwards by 2000 and 4000 counts, respectively.

Capacitance and dielectric loss measurements are shown in FIGS. 20, 21, and further confirm the excellent ferroelectric properties of our thin films. Capacitance and dissipation factor of BiT are slowly decreasing with increasing frequency and the dissipation factor is around 0.03 at high frequencies, consistent with the reported values. BiT-LC shows a similar behavior and value. Note that FIG. 20 has two different γ-axes on the left (Normalized capacitance) and right (Dissipation factor). Ellipses and arrows are drawn to indicate that upper curves are Normalized capacitance and lower curves are dissipation factor.

The voltage dependent capacitance plots in FIG. 21 show well-defined butterfly-like curves, confirming good ferroelectricity in both BiT and BiT-LC. These are important observations as alloying a simple perovskite type ferroelectric with heterovalent TMs typically introduces extra charges that induce a (semi-)metallic state and severely degrade the ferroelectricity. Therefore, the persistent ferroelectricity in BiT-LC further supports the model of preferential substitution of $Bi_2O_2$ sublayers based on STEM and XRD results described hereinabove: The $B_2Ti_3O_{10}$ sublayers remain mostly intact to reveal stable ferroelectricity in both BiT and BiT-LC.

Optical Bandgap Control

Figure 10:
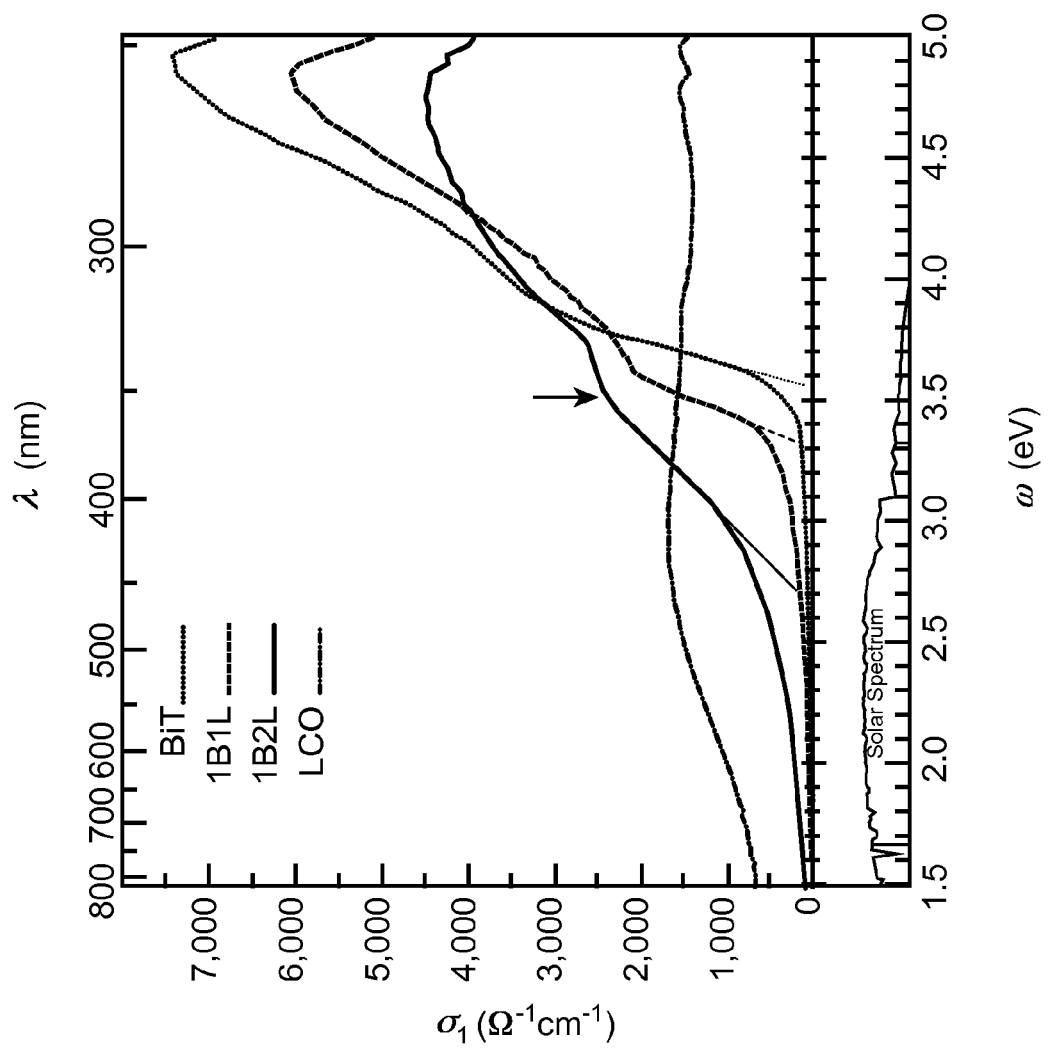
FIG. 10 is a graph showing optical conductivity ($\sigma1(\omega)$) of BiT, 1B1L, 1B2L, and LCO show a systematic and substantial decrease in band gap upon site-specific substitution of BiT with La and Co. The thickness of the spectra corresponds to the fitting error bar. Note that the non-zero $\sigma1(\omega)$ below the band gap (particularly for 1B2L) may be an artifact, originating from ellipsometry fitting procedure. The lighter gauge extrapolation lines indicate optical band gaps (Eg) of ~3.55, ~3.30, and ~2.65 eV for BiT, 1B1L, and 1B2L, respectively. The decreased band gap is mainly due to a state formed below the original band gap of BiT, as shown by the arrow. The optical band gap of 1B2L is well within the solar spectrum.
Figure 12:
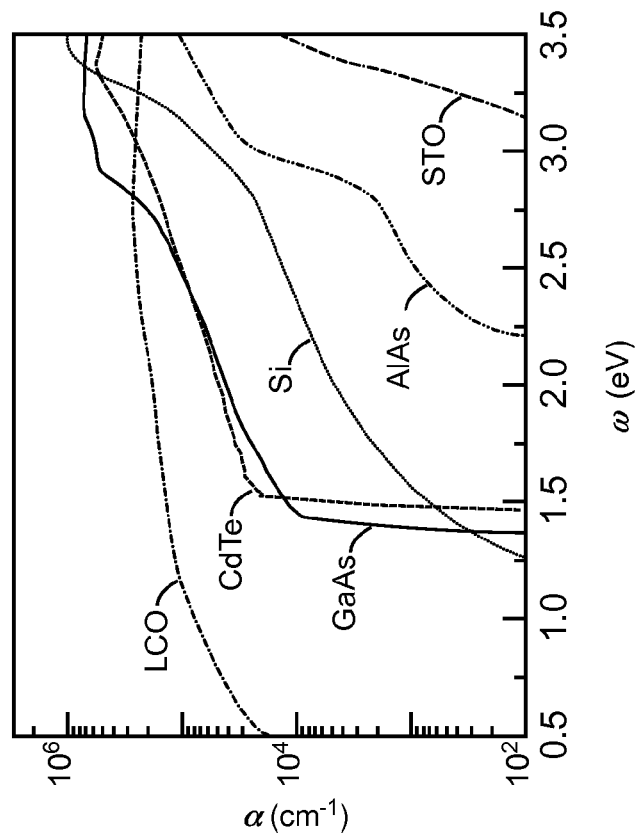
FIG. 12 is a graph showing absorption coefficient ($\alpha(\omega)$) of typical semiconductors GaAs, CdTe, crystalline Si, and AlAs (data taken from the dielectric constant database of WVASE32 (J. A. Woollam Co.)). $\alpha(\omega)$ of STO and LCO, measured using ellipsometry, are also shown. LCO has the advantage of a lower band gap and a higher $\alpha(\omega)$ as compared to the typical semiconductors.

The optical conductivity as a function of photon energy (σ1(ω)) of our BiLC films was measured using spectroscopic ellipsometry as shown in FIG. 10. While the largely undisturbed $Bi_2Ti_3O_{10}$ perovskite layers preserve the ferroelectricity in BiT-LC, the changes around the $Bi_2O_2$ sub-layer modify the optical properties substantially. Charge transfer excitations between O 2p and Ti 3d states are known to mainly contribute to the above bandgap. Thus, a significantly reduced bandgap is experimentally realized in our 1B2L films without reduction of polarization.

Figure 25:
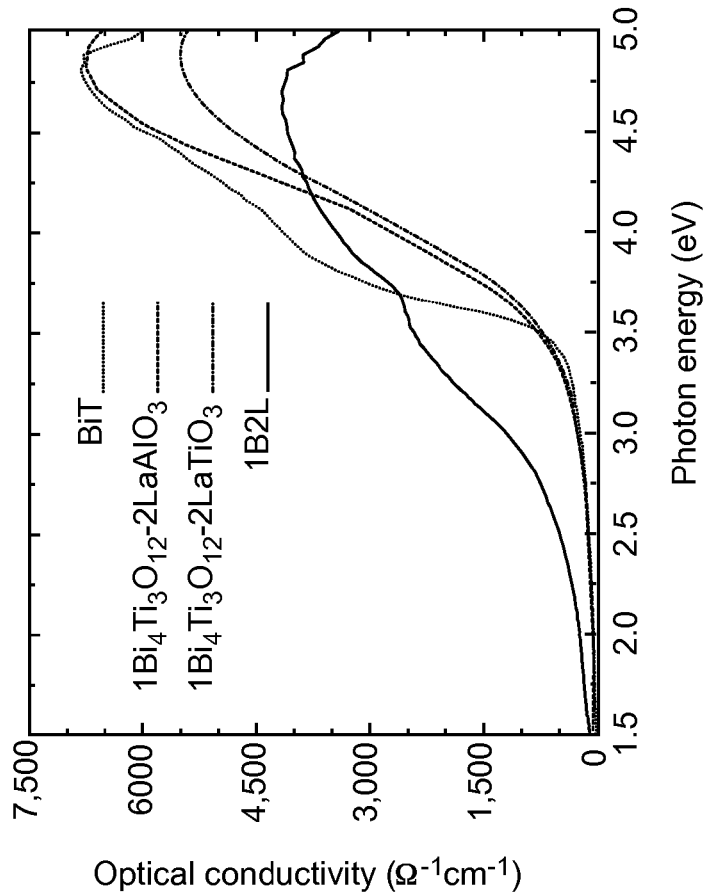
FIG. 25 is a graph showing optical conductivity spectra of $Bi_4Ti_3O_{12}$ doped with different $LaTMO_3$. $LaAlO_3$ and $LaTiO_3$ as alloying materials instead of LCO to make 1BiT-2$LaAlO_3$ and 1BiT-2$LaTiO_3$ films. Both films have similar band gaps as pure BiT, showing the importance of Co in decreasing the band gap in BiT.

It should be noted that the key ingredient to modify the electronic structure of Bi-LC is Co. Although it is present at a smaller concentration than La, the substitution is surprisingly effective in reducing the bandgap. Indeed, doping with only La in BiT is ineffective and known to rather slightly increase the bandgap of BiT. This has also been confirmed by testing the substitution with other elements (for example, Ti and Al using $LaTiO_3$ and $LaAlO_3$, respectively) instead of Co. Alloying with these elements did not change the bandgap of BiT at all, as shown in FIG. 25. Therefore, it is noteworthy to point out that Co has a critically important role in manipulating the bandgap of BiT.

Other transition metal elements, including V, Cr, Mn, and Ni, were tested in place of Co. The effect of the other transition metal elements on the band gap of $Bi_4Ti_3O_{12}$ was limited to a maximum of about 0.5 eV change. It is therefore contemplated that any transition metal element can be used, but Co was clearly superior for changing the band gap of $Bi_4Ti_3O_{12}$.

Electronic Structure

To understand the evolution of the electronic structure and the effectiveness of Co in reducing the bandgap of BiT-LC, we performed density functional theory calculations. Following the observations from the experiment, we substituted Ti near the $Bi_2O_2$ sub-layer with Co in our calculation. We focused on $Co^{2+}$ in the outer perovskite block in $Bi_2Ti_4O_{10}$ layer combined with an O vacancy, which we took as the apical O on the outside of the perovskite block consistent with the crystal chemistry of BiT.

Figure 13:
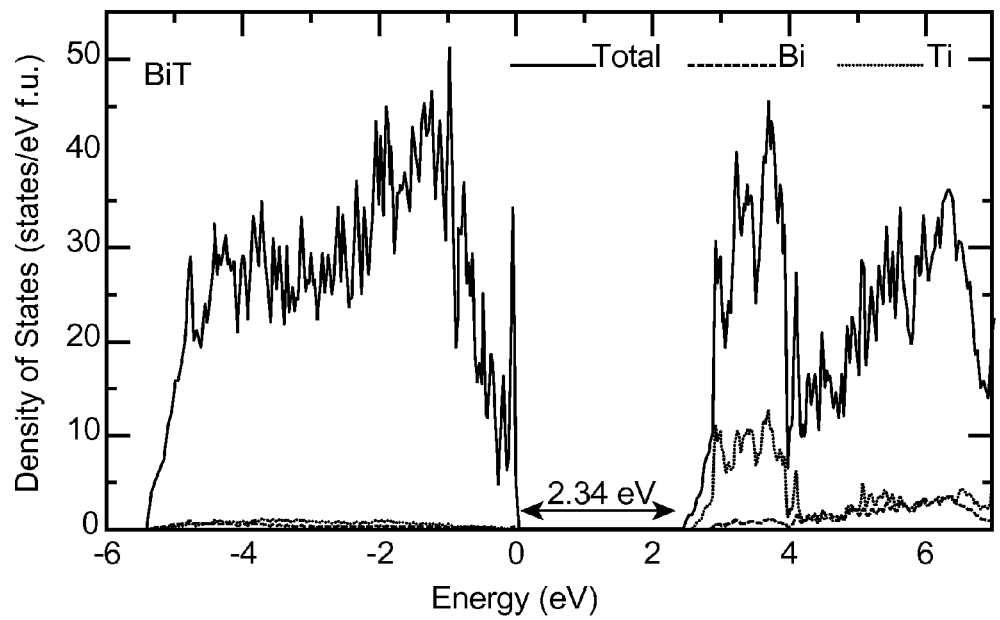
FIG. 13 is a graph showing calculated total electronic density of states (DOS) and projection onto the Bi and Ti atoms for BiT with PBE GGA. The obtained band gap is 2.34 eV (~1.2 eV smaller than the experimental result since standard density functional theory underestimates the gap value.)
Figure 14:
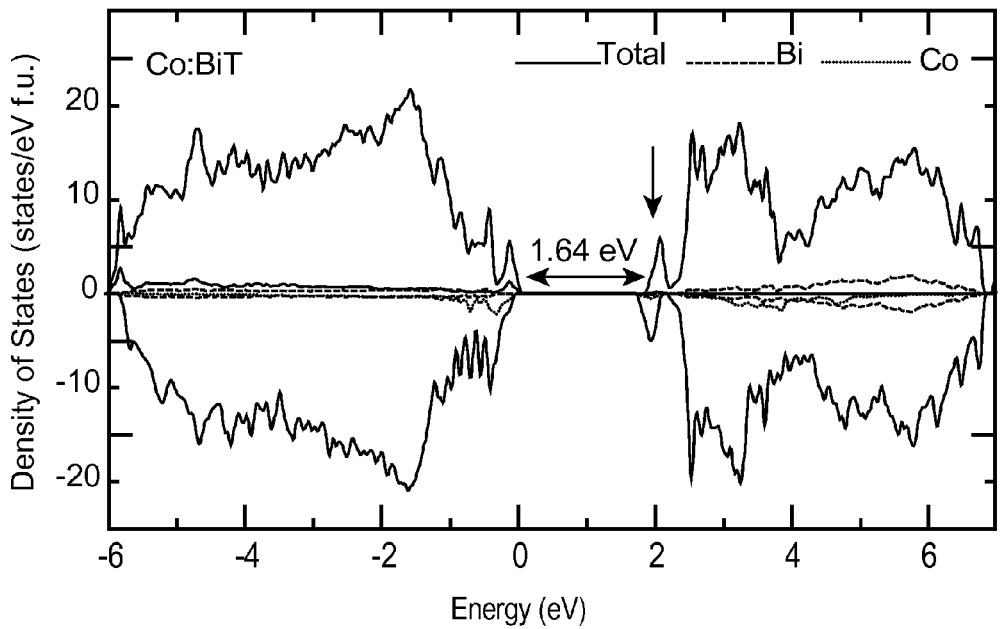
FIG. 14 is a graph showing calculated total electronic DOS and projection onto the Bi and Co atoms for the Co:BiT ($Bi_8Ti_5CoO_{23}$ supercell) with the PBE GGA and the PBE+U method with UJ=5 eV for Co atom. Majority and minority spins are shown as positive and negative, respectively. The obtained band gap for the Co:BiT is 1.64 eV, resulting in ~30% decrease in the band gap. The theoretical result is in accord with the experimental observation. The origin of the reduced band gap is additional states below the conduction band of BiT, indicated as an arrow. This enables charge transfer excitations below the band gap of BiT, shown as the same arrow in FIG. 10.
Figure 17:
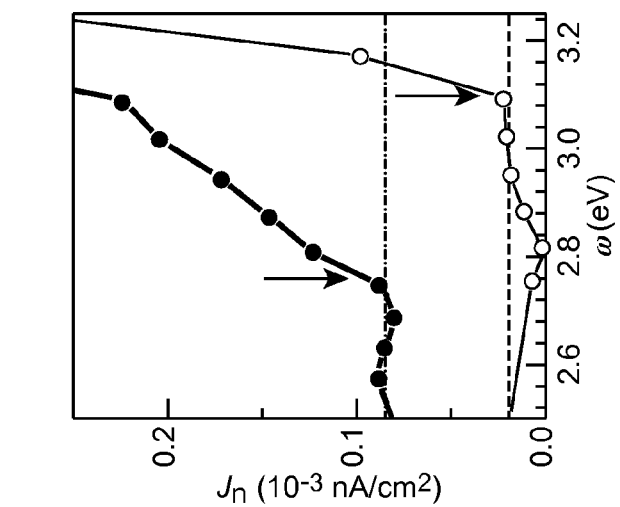
FIG. 17 is a graph showing a magnification of rectangle B in FIG. 16. Arrows indicate the onsets of photoconductance at 3.10 and 2.75 eV for BiT and 1B2L, respectively.

FIG. 14 shows the calculation result from Co:BiT, in comparison with that for pure BiT in FIG. 13. As usual, bandgaps are underestimated with standard density functional calculations. The calculated bandgap of 2.34 eV in pure BiT was reduced to 1.64 eV in the Co:BiT supercell, which is comparable to the 30% decrease observed by the ellipsometry. As shown in FIG. 14, the bandgap reduction in Co:BiT is mainly due to the split-off density of states in the conduction band (indicated as red arrow), meaning that there will be charge-transfer excitations below the pure BiT gap. This is consistent with the additional absorption peak in ellipsometry data, as indicated by the arrow in FIG. 10. The split-off states are mainly of Bi 6p character associated with the Bi atoms nearest to the O vacancy. Therefore, the decreased bandgap in BiT-LC can be attributed to the divalent Co incorporation into the BiT accompanied by O vacancies that pull Bi state down from the conduction band edge. This theoretical result shows that it is possible to obtain the electronic structure in accord with our experimental observations based on Co substitution combined with O vacancies. Such vacancies are to be expected in a Co-substituted substituted material because of the chemistry of Co and, in particular, the fact that the most common oxidation states of Co are +2 and +3.

Photoelectric Response

Figure 16:
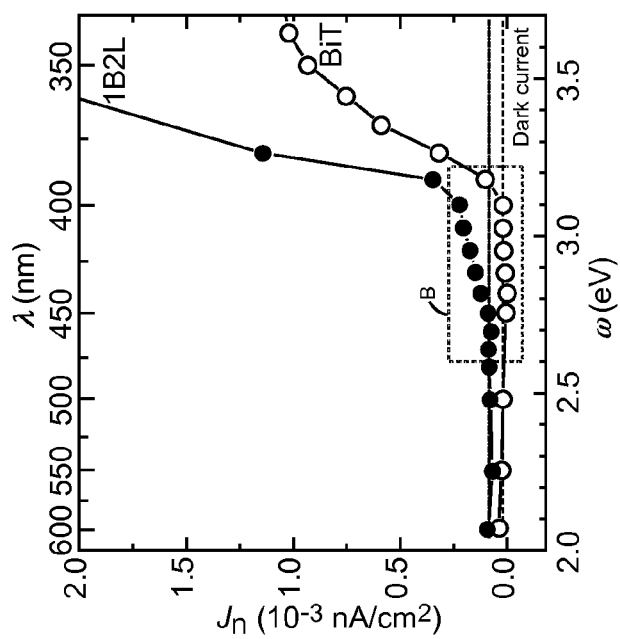
FIG. 16 is a graph summarizing photoconductance as a function of applied photon energy for BiT and 1B2L at 10 kV/cm. Horizontal dashed lines indicate the dark current for each sample.
Figure 15:
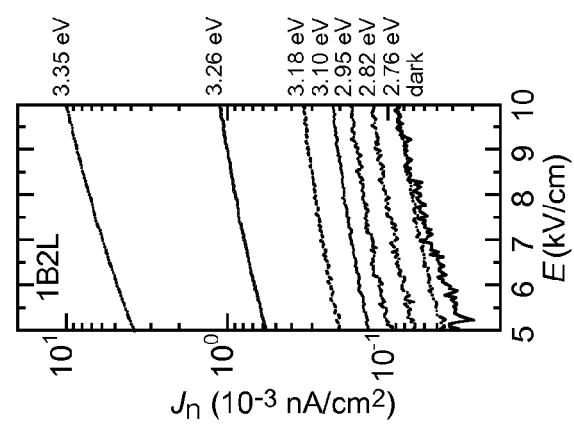
FIG. 15 is a graph showing Photon energy dependence of J(E) of a 1B2L film measured by illuminating light of various wavelengths using a monochromator. J is normalized to the number of photons at each wavelength.
Figure 19:
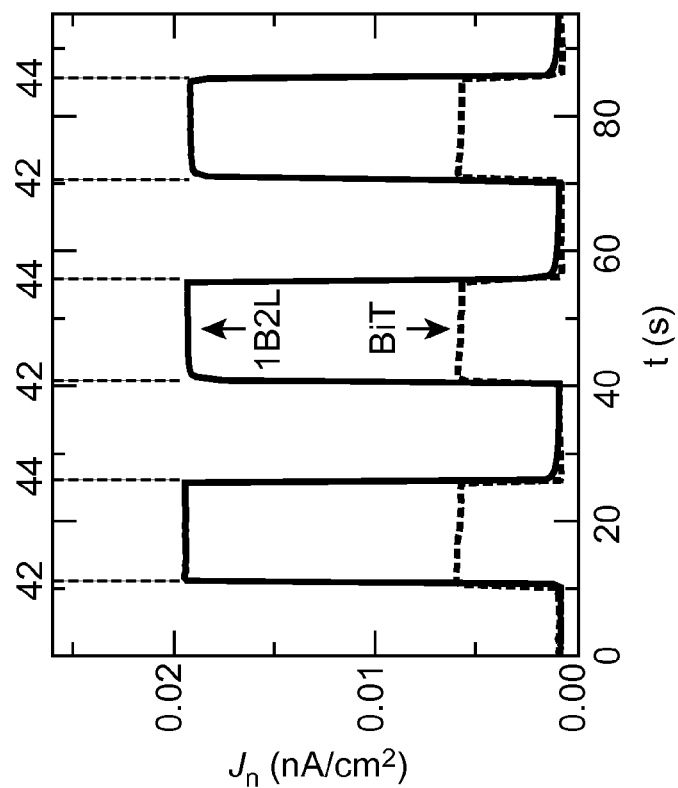
FIG. 19 is a graph showing photocurrent density recorded from BiT and 1B2L thin films by switching on and off the solar simulator at 20 kV/cm.
Figure 18:
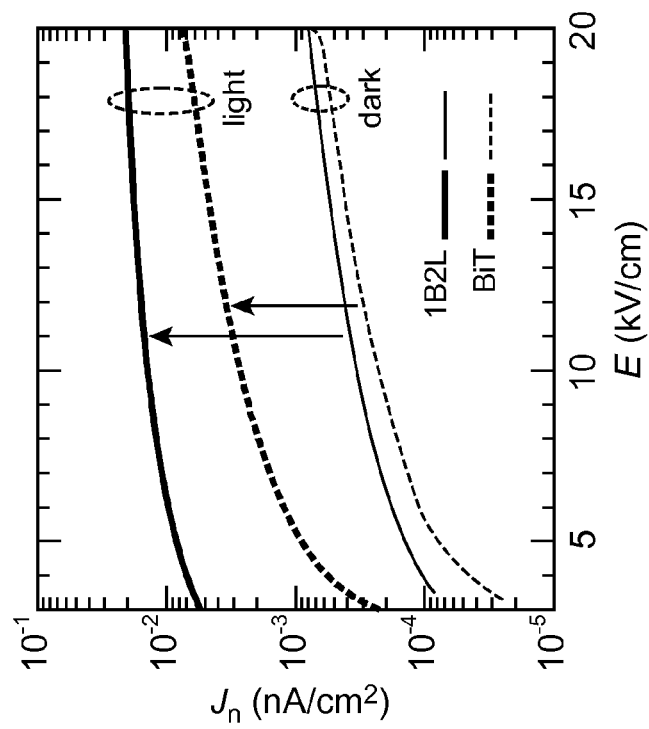
FIG. 18 is a graph showing J(E) curves from BiT and 1B2L thin films. Illumination of white light by a solar simulator (250 W) enhanced the current level by ~10 times for BiT and by ~35 times for 1B2L, as indicated by respective arrows.

The photocurrent depends on a variety of factors including α, bandgap, carrier mobility and light intensity. To see the effect of reduced bandgap, we measured photocurrent as a function of ω by using a monochromatic light source in the in-plane geometry. As shown in FIG. 15 for 1B2L, the current density as a function of applied electric field (J(E)) for ω smaller than 2.76 eV shows similar curves as dark J(E), indicating that there is no absorption of light. Increased photocurrent starts to appear for ω larger than 2.82 eV. FIG. 16 summarizes the wavelength-dependent photoconductance. J for 1B2L starts to increase at 2.82 eV, whereas J for pure BiT does not deviate from dark J until ω reaches 3.18 eV, clearly confirming the enhanced α and photoelectric response due to the reduced bandgap in BiT-LC. Note that the onset values approximately correspond to the bandgap energies shown in FIG. 10. This means that absorption at these energies below the bandgap of pure BiT yields mobile carriers that can participate in transport, as opposed to absorption that might come from fully localized defect states. Moreover, as there is increased absorption of visible light in BiT-LC owing to the reduced bandgap, one can expect an enhanced total photoelectric response. FIG. 18 shows J(E) for BiT and 1B2L using a white light with a solar simulator. Both samples show a highly insulating behavior in the dark. When the sample is illuminated, J increases by approximately an order of magnitude even for pure BiT. A substantially greater enhancement (approximately 35-fold increase of J) is observed from 1B2L. The enhancement of J in BiT-LC is more obviously shown in FIG. 19, where the time dependent J shows a clear step-like increase and decrease by turning on and off the light, respectively. This clearly demonstrates the ability of absorbing more photons by the site-specific substitution, which can be converted into electricity.

Figure 26:
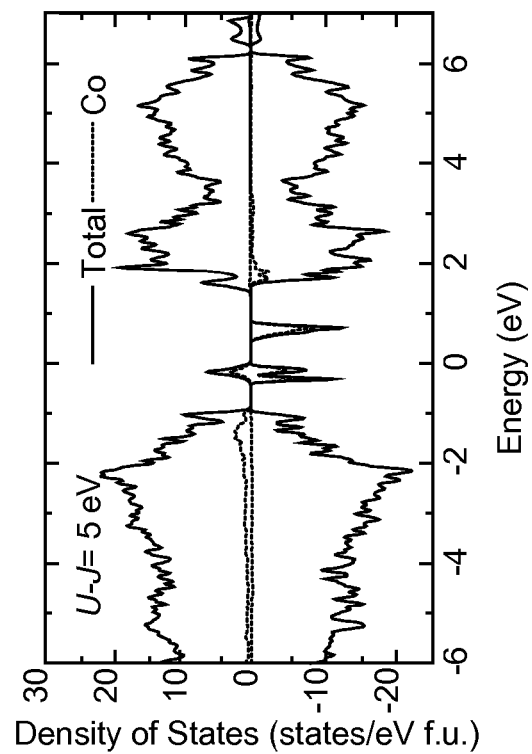
FIG. 26 is a graph showing electronic density of states of Co:BiT where U–J=0 eV.

Discussing the density functional theory (DFT) in additional detail, we chose $Co^{2+}$ instead of $Co^{3+}$ since more stable divalent Co compounds have band gaps in the range observed in the ellipsometry result as compared to $Co^{3+}$ compound-s, such as $LaCoO_3$. Furthermore, while $Co^{3+}$ would require a rather complex defect structure, $Co^{2+}$ requires simply one O vacancy along with the substitution of $Ti^{4+}$ with $Co^{2+}$ to satisfy the charge balance. It should also be noted that $Co^{4+}$ oxides such as de-intercalated $Li_xCoO_2$ or $SrCoO_3$ are chemically unstable and reactive. Therefore, a supercell of $Bi_8Ti_5CoO_{23}$ was constructed and then fully relaxed the internal atomic positions. As mentioned before, the relaxation was done including spin polarization so that Co could carry a moment. We indeed found out that this yields $Co^{2+}$ with a very stable magnetic moment of $3\mu_B$ per Co and a substantial gap in the Co d spectrum even with the standard PBE functional (U=0). The spin polarization of the host is due to the fact that there is only one Co atom in the supercell. This weak spin polarization would be averaged out in the paramagnetic alloy. Note that the Co is five-fold coordinated which yields a different crystal field scheme than an octahedral coordination. The four in-plane Co—O bond lengths range from 1.92 Å to 2.04 Å, while the single apical O (towards the center of the perovskite block) distance is 2.36 Å. The Co bond-valence sum for this site is 1.88, which is a reasonable value for $Co^{2+}$ in a chemically stable compound. The electronic density of states is shown in FIG. 26 for this calculation of PBE. With U−J=0 we find a gap of 0.48 eV of d-d character at the PBE level. The d-states in the gap are no doubt an artifact due to the neglect of the Coulomb repulsion on Co. As may be seen, there is a strong spin dependent hybridization of Co states in the O 2p derived valence bands. Importantly, there is a split-off state from the cation derived conduction bands. We also did PBE+U calculations with different values of U−J. FIG. 14 shows the PBE+U calculation result with U−J=5 eV applied to Co only. For values appropriate to 3d transition metal oxides as shown in FIG. 14, we find that the mid-gap d-states are in fact removed and become strongly mixed into the valence and conduction bands. The shape of the density of states is modified. However, in common with the UJ=0 calculation, we find a split-off density of states below the conduction band edge. This finding is insensitive to the value of U−J. This split-off density of states means that there will be charge transfer excitations from the valence bands below the pure compound gap consistent with our optical data.

Figure 27:
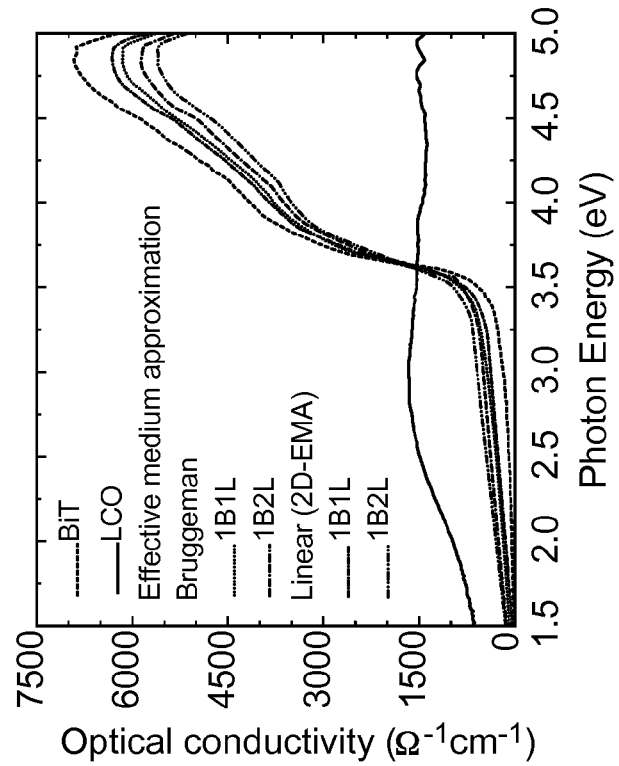
FIG. 27 is a graph showing effective medium approximation results. The EMA spectra are constructed based on the optical conductivity spectra of the constituent material: BiT and LCO. The result does not reproduce the observed experimental spectra shown in FIG. 10, validating the substantial modification of the electronic structure in our BiT-LC thin films.

In general, when an external material is introduced to a host material preserving their optical constants, the optical property of the whole material can be obtained from an effective medium approximation (EMA). We used two different EMA methods (Bruggeman and linear) to test this idea as shown in FIG. 27. Based on the pure BiT and LCO dielectric spectra, we constructed optical conductivity spectra for 1B1L and 1B2L. Note that the nominal volume ratios of LCO within the samples are 11.9% and 23.7%, respectively, for 1B1L and 1B2L. As shown in FIG. 27, neither EMA methods could reproduce our experimental optical conductivity spectra. In particular, we did not observe any additional states that cause the band gap reduction. The result, therefore, indicates the substantial modification of the electronic structure as shown in theoretical calculation is necessary to satisfy the observed band gap change.

Figure 28:
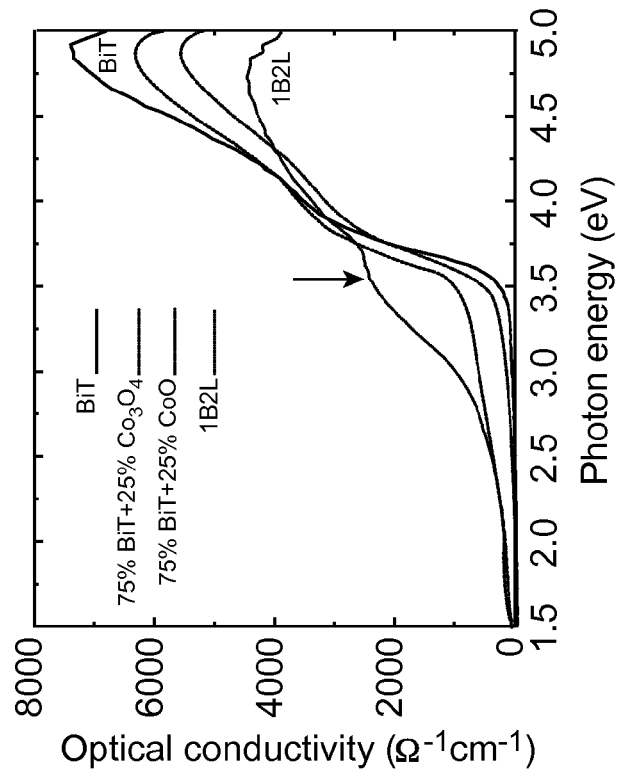
FIG. 28 is a graph showing simulated optical conductivity spectra with cobalt oxide impurities. The spectra were obtained from the Bruggeman EMA for mixtures of BiT and cobalt oxides. The volume fraction of the cobalt oxides was set to 25% of the whole composite. The weak peak features at ~1.7 and ~2.8 eV in EMA of BiT-$Co_3O_4$ are indicated as arrows. The spectra of BiT and 1B2L are also shown as comparison.

It has been known that Co easily forms cobalt oxide phases (Usually $Co_3O_4$ or CoO). We carefully examined the possible formation of such Co-based secondary phases and their influence to our optical conductivity spectra. First of all, from XRD measurements, we could not see any of the secondary phases. Second, if such phases were to be formed, the band gap would not decrease systematically with increasing LCO incorporation. Rather, the absorption will increase above the modified band gap. To further confirm that the cobalt oxide phases are not contributing to the reduced band gap, we used the following EMA analyses. We tested Bruggeman EMAS using optical properties of BiT, $Co_3O_4$, and CoO, as shown in FIG. 28. Linear EMA gave very similar results. The results clearly showed that the band gap reduction could not be realized, even if there exist a significant amount of such cobalt oxides within the BiT film. Specifically, the peak at 3.4 eV in 1B2L, and the band gap change due to this absorption could not be observed in the EMA. Also note that the EMA of BiT and $Co_3O_4$ showed some absorption at low photon energy as shown as arrows in FIG. 28. This is due to the low-lying absorption of $Co_3O_4$ at ~1.7 and ~2.8 eV. The absence of such peaks in 1B2L affirms that the contribution of $Co_3O_4$ is very minuscule (if there is any) to the optical property of our 1B2L film, unambiguously validating the effect of Co substitution in BiT on the band gap reduction. The compositions of the present invention can be characterized by a band gap of less than 4.5 eV, less than 4.4 eV less than 4.3 eV less than 4.2 eV less than 4.1 eV less than 4.0 eV, less than 3.9 eV, less than 3.8 eV, less than 3.7 eV, less than 3.6 eV, and/or less than 3.5 eV.

Site-specific substitution in anisotropic oxides is shown to be an effective way of tuning bandgaps in complex TMOs. In particular, we showed the example of ferroelectric oxide BiT, where the bandgap could be systematically controlled by site-specific substitutional alloying with LCO. This approach should not be limited to ferroelectrics but could be adapted to other oxide systems that have various exotic and useful characteristics. For example, by changing n in Ruddlesden-Popper series $Sr_{n+1}Ti_nO_{3n+1}$, it has been shown that the band gap of the system could be systematically modified. Also, the atomic controlled superlattices composed of $BaTiO_3$, $SrTiO_3$, and $CaTiO_3$, which showed an enhancement of ferroelectricity, could also be a good transition metal oxide model system to test the band gap modification.

The compositions of the present invention can be deposited, optionally epitaxially, on a variety of substrates. Some suitable substrates include, but are not limited to Si, Ge, $SrTiO_3$, $LaAlO_3$, $BaTiO_3$, $CaTiO_3$, $(LaAlO_3)_6(Sr2AlTaO_6)_7$, SrTiO3/Si, YSZ, and YSZ/Si.

While there has been shown and described what are at present considered to be examples of the invention, it will be obvious to those skilled in the art that various changes and modifications can be prepared therein without departing from the scope of the inventions defined by the appended claims.

What is claimed is:

1. A transition metal oxide insulator composition having a tuned band gap comprising:
   a. a transition metal oxide having a crystalline structure selected from the group consisting of a perovskite crystalline structure and a perovskite-like crystalline structure, said transition metal oxide comprising: at least one first element selected from the group consisting of Bi, Ca, Ba, Sr, Li, Na, Mg, K, Pb, and Pr; and at least one second element selected from the group consisting of Ti, Al, V, Cr, Mn, Fe, Co, Ni, Cu, Zr, Nb, Mo, Ru, Rh, Pd, Hf, Ta, W, Re, Os, Ir, and Pt; and b. at least one correlated insulator integrated into said crystalline structure, said correlated insulator comprising $REMO_3$, wherein RE is at least one element selected from the group consisting of La, Ce, Pr, Nd, Pm, Sm, Eu, Gd, Tb, Dy, Ho, Er, Tm, Yb, and Lu, and wherein M is at least one element selected from the group consisting of Co, V, Cr, Ni, Mn, and Fe;

said composition being characterized by a band gap of less than 4.5 eV.

2. A transition metal oxide insulator composition in accordance with claim 1 wherein said crystalline structure is selected from the group consisting of a layered tetragonal crystalline structure and a pseudo-orthorhombic crystalline structure.

3. A transition metal oxide insulator composition in accordance with claim 1 wherein said first element comprises Bi.

4. A transition metal oxide insulator composition in accordance with claim 1 wherein said second element comprises Ti.

5. A transition metal oxide insulator composition in accordance with claim 1 wherein RE comprises La.

6. A transition metal oxide insulator composition in accordance with claim wherein M comprises Co.

7. A transition metal oxide insulator composition in accordance with claim 1 wherein said correlated insulator comprises $LaCoO_3$.

8. A transition metal oxide insulator composition in accordance with claim 1 wherein said band gap is less than 4.0 eV.

9. A transition metal oxide insulator composition in accordance with claim 1 further comprising a substrate upon which said transition metal oxide insulator composition is disposed.

10. A transition metal oxide insulator composition in accordance with claim 9 wherein said transition metal oxide insulator composition is disposed epitaxially on said substrate.

11. A transition metal oxide insulator composition in accordance with claim 9 wherein said substrate comprises at least one material selected from the group consisting of Si, Ge, $SrTiO_3$, $LaAlO_3$, $BaTiO_3$, $CaTiO_3$, $(LaAlO_3)_6 (Sr2AlTaO_6)_7$, SrTiO3/Si, YSZ, and YSZ/Si.

12. A transition metal oxide insulator composition in accordance with claim 1 wherein said transition metal oxide comprises $Bi_4Ti_3O_{12}$ and wherein said correlated insulator comprises $LaCoO_3$.

13. A transition metal oxide insulator composition in accordance with claim 1 wherein said composition corresponds to the formula $1Bi_4Ti_3O_{12}$—$1LaCoO_3$.

14. A transition metal oxide insulator composition in accordance with claim 1 wherein said composition corresponds to the formula $1Bi_4Ti_3O_{12}$—$2LaCoO_3$.

* * * * *